United States Patent
Choi

(10) Patent No.: US 10,192,907 B2
(45) Date of Patent: Jan. 29, 2019

(54) ARRAY SUBSTRATE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventor: Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/519,937

(22) PCT Filed: Mar. 14, 2016

(86) PCT No.: PCT/CN2016/076260
§ 371 (c)(1),
(2) Date: Apr. 18, 2017

(87) PCT Pub. No.: WO2016/169355
PCT Pub. Date: Oct. 27, 2016

(65) Prior Publication Data
US 2017/0373102 A1 Dec. 28, 2017

(30) Foreign Application Priority Data

Apr. 23, 2015 (CN) .......................... 2015 1 0197982

(51) Int. Cl.
*H01L 27/12* (2006.01)
*H01L 29/38* (2006.01)
(Continued)

(52) U.S. Cl.
CPC ...... *H01L 27/1288* (2013.01); *H01L 21/0274* (2013.01); *H01L 21/77* (2013.01);
(Continued)

(58) Field of Classification Search
CPC ............... H01L 27/1288; H01L 27/124; H01L 27/1262; H01L 29/42; H01L 29/384;
(Continued)

(56) References Cited

U.S. PATENT DOCUMENTS 4,280,754 A * 7/1981 Yano ...................... G02F 1/1523
359/267
4,298,786 A * 11/1981 Marciniec .............. B41J 2/3351
101/31
(Continued)

FOREIGN PATENT DOCUMENTS

CN 102709189 A 10/2012
CN 102790012 A 11/2012
(Continued)

OTHER PUBLICATIONS

Search Report and Written Opinion dated Jun. 14, 2016 from State Intellectual Property Office of the P.R. China.
Chinese Office Action dated Dec. 2, 2015.

*Primary Examiner* — Ida M Soward
(74) *Attorney, Agent, or Firm* — Dilworth & Barrese, LLP; Michael J. Musella, Esq.

(57) ABSTRACT

An array substrate and manufacturing method thereof, display panel and display device. The manufacturing method of the array substrate includes: forming, on a substrate, a first conductive pattern, a second conductive pattern and an insulating pattern, the insulating pattern at least covering an upper surface of the first conducting pattern, the first conductive pattern including a first amorphous transparent conductive pattern and a first metal pattern, and the second conductive pattern including a second amorphous transparent conductive pattern; and performing an annealing treatment to convert the first amorphous transparent conductive pattern and the second amorphous transparent conductive pattern to a first crystalline transparent conductive pattern
(Continued)

and a second crystalline transparent conductive pattern respectively. The method addresses the problem in which a metal surface is readily oxidizable when performing an annealing treatment, thereby improving the product yield.

20 Claims, 5 Drawing Sheets

(51) Int. Cl.

| | |
|---|---|
| H01L 29/45 | (2006.01) |
| H01L 21/10 | (2006.01) |
| H01L 21/30 | (2006.01) |
| H01L 51/44 | (2006.01) |
| H01L 51/52 | (2006.01) |
| H01L 51/00 | (2006.01) |
| H01L 33/42 | (2010.01) |
| H01L 33/00 | (2010.01) |
| H01L 31/02 | (2006.01) |
| H01L 31/18 | (2006.01) |
| H01L 21/77 | (2017.01) |
| H01L 21/027 | (2006.01) |
| H01L 29/423 | (2006.01) |

(52) U.S. Cl.
CPC ............ *H01L 27/12* (2013.01); *H01L 27/124* (2013.01); *H01L 27/1262* (2013.01); *H01L 29/42384* (2013.01); *H01L 29/45* (2013.01)

(58) Field of Classification Search
CPC . H01L 29/45; H01L 21/10274; H01L 51/442; H01L 51/5234; H01L 51/0023; H01L 33/42; H01L 33/0095; H01L 31/022466; H01L 31/1884; H01L 2251/305; H01L 21/0332; H01L 21/3081
See application file for complete search history.

(56) References Cited

U.S. PATENT DOCUMENTS

| | | | | |
|---|---|---|---|---|
| 4,543,573 | A * | 9/1985 | Fuyama | ............... B23K 35/001 257/724 |
| 6,096,482 | A * | 8/2000 | Omote | ............... C08G 73/1025 430/311 |
| 6,855,636 | B2 * | 2/2005 | Theiss | ................. H01L 51/0008 430/200 |
| 7,022,557 | B2 * | 4/2006 | Kim | ..................... G02F 1/13458 257/E27.111 |
| 7,166,864 | B2 * | 1/2007 | Ahn | ..................... G02F 1/13458 257/72 |
| 7,416,926 | B2 * | 8/2008 | Heo | ..................... G02F 1/13458 257/E31.079 |
| 7,473,150 | B2 * | 1/2009 | Hsu | ..................... H01L 33/0004 257/103 |
| 8,969,875 | B2 * | 3/2015 | Nam | ..................... H01L 27/124 257/291 |
| 2006/0055323 | A1 * | 3/2006 | Hatanaka | ................. H01J 11/12 313/583 |
| 2007/0170145 | A1 | 7/2007 | Chin et al. | |
| 2014/0159255 | A1 * | 6/2014 | Li | ........................... H01L 23/60 257/782 |
| 2015/0359109 | A1 * | 12/2015 | Hwang | ................. H01L 51/445 174/257 |

FOREIGN PATENT DOCUMENTS

| | | | | |
|---|---|---|---|---|
| CN | 103123910 A | 5/2013 | | |
| CN | 103489902 A | 1/2014 | | |
| CN | 104795407 A | 7/2015 | | |
| JP | 58000140 A | * | 1/1983 | ............ H01L 24/48 |
| KR | 20130079459 A | * | 7/2013 | ............ G06F 3/041 |

* cited by examiner

ARRAY SUBSTRATE AND MANUFACTURING METHOD THEREOF, DISPLAY PANEL AND DISPLAY DEVICE

TECHNICAL FIELD

At least one embodiment of the present disclosure relates to an array substrate, a manufacturing method thereof, a display panel and a display device.

BACKGROUND

In general, in order to reduce the patterning processes for forming layer structures in an array substrate, gray-tone mask or half-tone mask process is generally adopted. A plurality of patterns, for example, structures such as a gate electrode, a gate line, a common electrode and a common electrode line for connecting the common electrode, are formed in the same patterning process, so that the process steps of independently forming the patterns can be simplified. The typical patterning process includes the steps such as film forming, exposure, development, etching and stripping.

For example, transparent electrodes such as common electrodes are usually made from transparent conductive materials with high transmittance such as indium tin oxide (ITO), and metallic electrodes such as gate electrodes, gate lines and common electrode lines are usually made from metallic materials with low resistance such as Cu. Amorphous indium tin oxide (a-ITO) is directly formed in the process of ITO film forming and must be subjected to annealing, so that the a-ITO can be converted into polycrystalline indium tin oxide (p-ITO), and the p-ITO has low electric resistivity and has a transmittance satisfying the design requirement of a display panel. In addition, when the metal material Cu is subjected to annealing, the residual stress can be also eliminated, and the internal structural defects such as deformation and crack tendency can be also reduced.

SUMMARY

Embodiments of the present disclosure provide an array substrate, a manufacturing method thereof, a display panel and a display device, which can solve the problem of easy oxidization of a surface of a metallic electrode in an annealing process and improve the product yield.

At least one embodiment of the present disclosure provides a manufacturing method of an array substrate, including: forming a first conductive pattern, a second conductive pattern, and an insulating pattern which at least covers an upper surface of the first conductive pattern on a base substrate, wherein the first conductive pattern includes: a first amorphous transparent conductive pattern and a first metallic pattern which are away from the base substrate in sequence, and the second conductive pattern includes a second amorphous transparent conductive pattern; and annealing the base substrate with the first conductive pattern, the second conductive pattern and the insulating pattern formed thereon so that the first amorphous transparent conductive pattern and the second amorphous transparent conductive pattern are respectively converted into a first crystalline transparent conductive pattern and a second crystalline transparent conductive pattern.

For example, according to the manufacturing method of the array substrate provided by an embodiment of the present disclosure, the first conductive pattern and the second conductive pattern are formed by one patterning process.

For example, according to the manufacturing method of the array substrate provided by an embodiment of the present disclosure, the insulating pattern, the first conductive pattern and the second conductive pattern are formed in a same patterning process.

For example, according to the manufacturing method of the array substrate provided by an embodiment of the present disclosure, forming the insulating pattern, the first conductive pattern and the second conductive pattern in the same patterning process includes: sequentially forming a transparent conductive film, a metallic film, an insulating film and photoresist on the base substrate; performing exposure and development to the photoresist formed on the base substrate via a half-tone mask or a gray-tone mask, so as to form a photoresist-completely-retained portion, a photoresist-partially-retained portion and a photoresist-completely-removed region, wherein the photoresist-completely-retained portion corresponds to an area of the first conductive pattern to be formed; the photoresist-partially-retained portion corresponds to an area of the second conductive pattern to be formed; and the photoresist-completely-removed region corresponds to other areas; removing a portion of the insulating film, the metallic film and the transparent conductive film corresponding to the photoresist-completely-removed region by an etching process; removing the photoresist-partially-retained portion by an ashing process; removing a portion of the insulating film and the metallic film corresponding to the photoresist-partially-retained portion by an etching process, and forming the first conductive pattern and the second conductive pattern; and removing the photoresist-completely-retained portion by a stripping process, and exposing the insulating pattern.

For example, according to the manufacturing method of the array substrate provided by an embodiment of the present disclosure, the first metallic pattern includes: a first metallic alloy layer and a first elemental metal layer which are away from the base substrate in sequence.

For example, according to the manufacturing method of the array substrate provided by an embodiment of the present disclosure, the first conductive pattern includes at least one selected from the group consisted of a pattern of a gate electrode, a pattern of a gate line, and a pattern of a common electrode line.

For example, according to the manufacturing method of the array substrate provided by an embodiment of the present disclosure, the second conductive pattern includes a pattern of a common electrode or a pattern of a pixel electrode.

For example, according to the manufacturing method of the array substrate provided by an embodiment of the present disclosure, the first conductive pattern includes the pattern of the common electrode line; and a portion of the first amorphous transparent conductive pattern corresponding to the common electrode line and the second amorphous transparent conductive pattern are of an integral structure.

For example, according to the manufacturing method of the array substrate provided by an embodiment of the present disclosure, further including: forming a gate insulating layer on the base substrate with the first conductive pattern, the second conductive pattern and the insulating pattern formed thereon.

At least one embodiment of the present disclosure provides an array substrate, including: a base substrate; and a first conductive pattern, a second conductive pattern, and an insulating pattern disposed on the base substrate, the insulating pattern at least covering an upper surface of the first conductive pattern, wherein the first conductive pattern includes a first crystalline transparent conductive pattern and a first metallic pattern which are away from the base substrate in sequence; and the second conductive pattern includes a second crystalline transparent conductive pattern.

For example, according to the array substrate provided by an embodiment of the present disclosure, the first metallic pattern includes: a first metallic alloy layer and a first elemental metal layer which are away from the base substrate in sequence.

For example, according to the array substrate provided by an embodiment of the present disclosure, the first conductive pattern includes at least one selected from the group consisted of a pattern of a gate electrode, a pattern of a gate line, and a pattern of a common electrode line.

For example, according to the array substrate provided by an embodiment of the present disclosure, the second conductive pattern includes a pattern of a common electrode or a pattern of a pixel electrode.

For example, according to the array substrate provided by an embodiment of the present disclosure, the first conductive pattern includes the pattern of the common electrode line; and a portion of the first crystalline transparent conductive pattern corresponding to the common electrode line and the second crystalline transparent conductive pattern are of an integral structure.

For example, according to the array substrate provided by an embodiment of the present disclosure, further including: a gate insulating layer disposed on the base substrate provided with the first conductive pattern, the second conductive pattern and the insulating pattern.

For example, according to the array substrate provided by an embodiment of the present disclosure, the first crystalline transparent conductive pattern and the second crystalline transparent conductive pattern are disposed in a same layer.

At least one embodiment of the present disclosure provides a display panel, including the array substrate provided by any one of the embodiments of the present disclosure.

At least one embodiment of the present disclosure provides a display device, including the display panel provided by any one of the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

100—base substrate; 101—transparent conductive film; 102—metallic film; 103—insulating film; 104—photoresist; 104a—photoresist-completely-retained portion; 104b—photoresist-partially-retained portion; 104c—photoresist-completely-removed region; 105—half-tone mask; 105a—completely opaque region; 105b—partially transparent region; 105c—completely transparent region; 10—first conductive pattern; 10a—upper surface; 11—first amorphous transparent conductive pattern; 12—first metallic pattern; 12a—first base layer/first metallic alloy layer; 12b—first metal layer; 13—gate line; 14—common electrode line; 20—second conductive pattern; 21—second amorphous transparent conductive pattern; 22—common electrode; 23—pixel electrode; 30—insulating pattern; 31—gate insulating layer.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figures 1, 2:
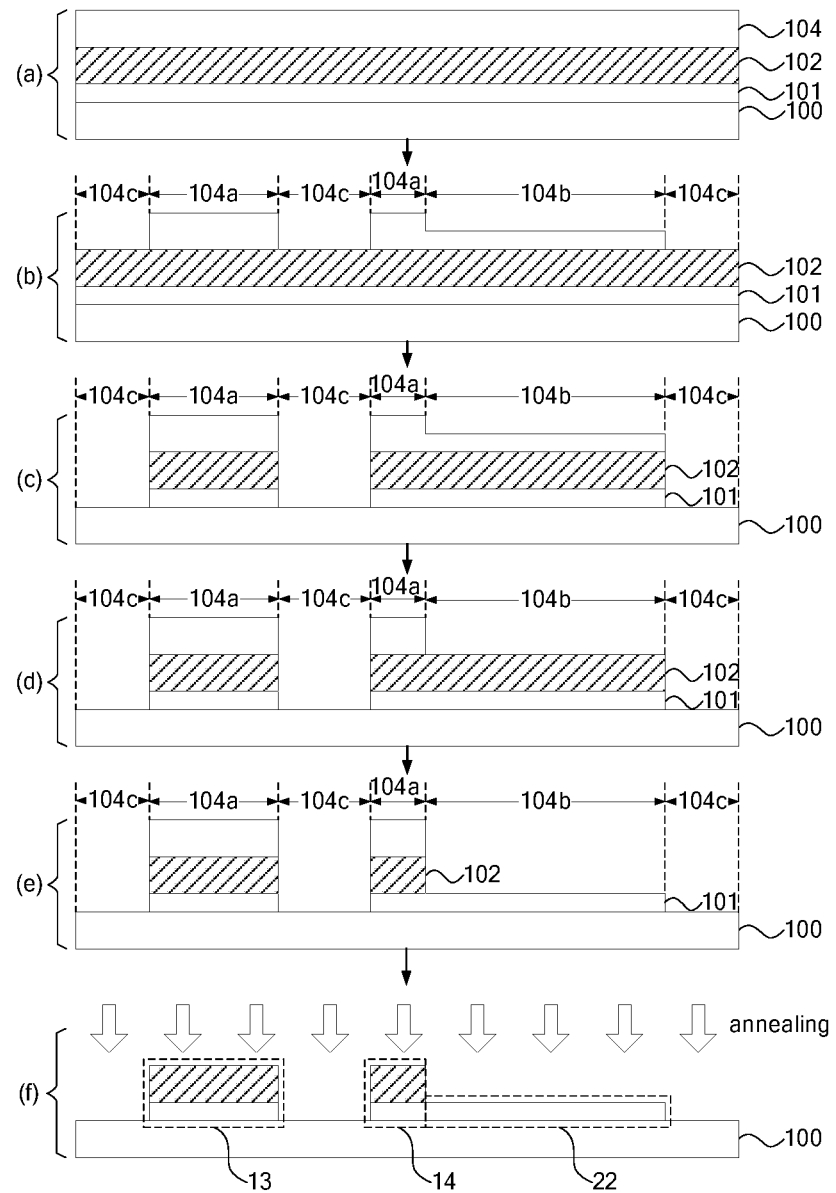
FIG. 1 is a schematic diagram illustrating forming a common electrode, a common electrode line, a gate electrode and a gate line by one patterning process.
FIG. 2 is a corresponding numerical table of annealing temperature and thickness of a Cu oxide layer, and annealing temperature and resistance in the same atmosphere condition in a conventional technique.

As illustrated in FIG. 1, a patterning process includes the following steps:

Step (a): sequentially forming a transparent conductive film 101, a metallic film 102 and photoresist 104 on a base substrate 100. The transparent conductive film is made from, for example, ITO.

Step (b): performing exposure and development on the photoresist by a half-tone mask or a gray-tone mask, and forming a photoresist-completely-retained portion 104a corresponding to a gate electrode, a gate line and a common electrode line, a photoresist-partially-retained portion 104b corresponding to a common electrode 22, and a photoresist-completely-removed region 104c corresponding to other areas.

Step (c): removing a portion of the transparent conductive film 101 and the metallic film 102 corresponding to the photoresist-completely-removed region by etching.

Step (d): removing the photoresist-partially-retained portion by an ashing process, and exposing a portion of the metallic film 102 covered by the photoresist-partially-retained portion previously.

Step (e): etching the portion of the metallic film 102 exposed after removing the photoresist-partially-retained portion, and forming the common electrode 22.

Step (f): removing the photoresist-completely-retained portion by stripping, annealing the substrate provided with the above patterns, and subsequently, continuously performing the subsequent manufacturing processes such as the deposition of a gate insulating layer.

However, in the process of annealing the substrate, a surface of Cu away from the base substrate 100 (or away from the transparent conductive film) can be easily oxidized, so that unqualified products can be caused. As illustrated by the table in FIG. 2, under the same annealing atmosphere and the same annealing time, a thickness of an oxide layer generated on the surface of Cu is in direct proportion to the annealing temperature. When the temperature is raised, the thickness of the oxide layer is also increased, and corresponding resistance is also obviously increased, so that the energy consumption, in the process of transmitting corresponding electric signals through metal electrodes such as the gate lines, can be increased. Moreover, when the resistance is obviously increased to a certain degree, it is equivalent that the metal electrode such as the gate line is disconnected, so that the array substrate can difficultly achieve normal image display.

Figure 3:
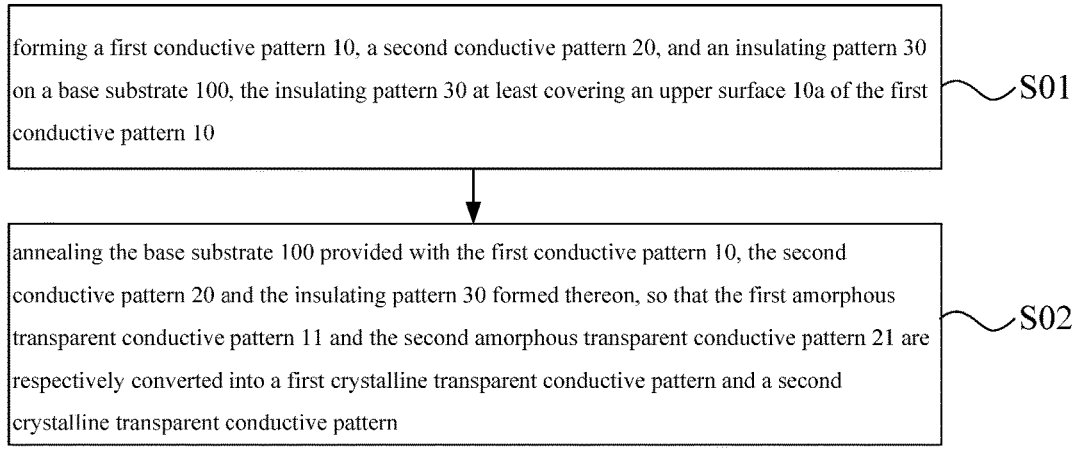
FIG. 3 is a flowchart of a manufacturing method of an array substrate provided by an embodiment of the present disclosure.
Figure 4A:
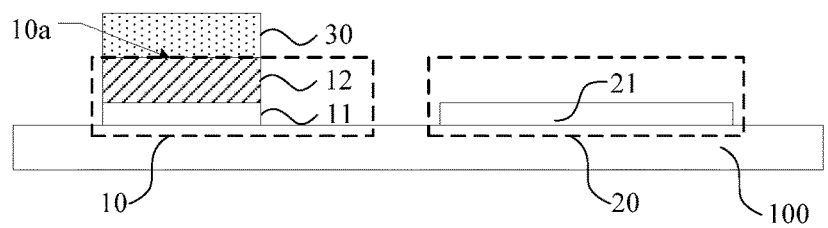
FIGS. 4a and 4b are respectively schematic diagrams of the steps S01 and S02 in FIG. 3.
Figure 4B:
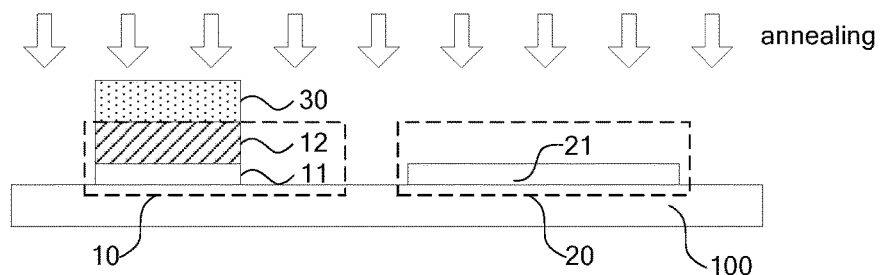

An embodiment of the present disclosure provides a manufacturing method of an array substrate. As illustrated in FIGS. 3, 4a and 4b, the manufacturing method includes the following steps.

S01: as illustrated in FIG. 4a, forming a first conductive pattern 10, a second conductive pattern 20, and an insulating pattern 30 on a base substrate 100, the insulating pattern 30 at least covering an upper surface 10a of the first conductive pattern 10.

The first conductive pattern 20 includes a first amorphous transparent conductive pattern 11 and a first metallic pattern 12 which are away from the base substrate 100 in sequence, and the second conductive pattern 20 includes a second amorphous transparent conductive pattern 21. For example, the first conductive pattern 10 and the second conductive pattern 20 are formed by one patterning process.

For example, the upper surface 10a of the first conductive pattern 10 refers to a surface of the first conductive pattern 10 away from the base substrate 100.

S02: as illustrated in FIG. 4b, annealing the base substrate 100 provided with the first conductive pattern 10, the second conductive pattern 20 and the insulating pattern 30 formed thereon, so that the first amorphous transparent conductive pattern 11 and the second amorphous transparent conductive pattern 21 can be respectively converted into a first crystalline transparent conductive pattern and a second crystalline transparent conductive pattern.

The following should be noted.

Firstly, the first conductive pattern 10 can be multiple and distributed at different positions of the base substrate 100. In the embodiment, all the patterns formed by the first amorphous transparent conductive pattern 11 and the first metallic pattern 12 can be referred to as the first conductive pattern 10.

For example, when the first conductive pattern 10 is multiple, the patterns which are referred to as the first conductive pattern 10 can have different functions, and can also be represented by different names according to the specific functions in the field of display technology.

Illustratively, as thin film transistors (TFTs) in the array substrate can have a plurality of structural types, e.g., bottom-gate type (namely a gate electrode is disposed on one side of an active layer close to the base substrate) or top-gate type (namely a gate electrode is disposed on one side of an active layer away from the base substrate). Therefore, the first conductive pattern 10 can include but not limited to at least one selected from the group consisted of a pattern of a gate electrode, a pattern of a gate line connected with the gate electrode, and a pattern of a common electrode line in the array substrate; or the first conductive pattern 10 can also include but not limited to a pattern of source/drain electrodes and a pattern of a data line connected with the source electrode in the array substrate.

Similarly, the second conductive pattern 20 can include but not limited to a pattern of a common electrode or a pattern of a pixel electrode. Limitations are not imposed thereto. Changes can be made according to different specific structures.

Secondly, that the insulating pattern 30 at least covers the upper surface 10a of the first conductive pattern 10 away from the base substrate refers to that: as illustrated in FIG. 4a, the insulating pattern 30 can be only disposed on the upper surface 10a of the first conductive pattern 10, namely having the same pattern with the first conductive pattern 10; or the insulating pattern 30 can also be disposed on the base substrate 100 with the first conductive pattern 10 and the second conductive pattern 20 formed thereon, namely covering the first conductive pattern 10, the second conductive pattern 20 and other areas. For example, in a case that the first conductive pattern 10 includes at least one selected from the group consisted of the pattern of the gate electrode, the pattern of the gate line connected with the gate electrode, or the pattern of the common electrode line, in the array substrate, the insulating pattern 30 covering the entire base substrate 100 can be a gate insulating layer in the array substrate.

As the insulating pattern 30 is at least formed on the first metallic pattern 12, the insulating pattern has the function of preventing a surface of the first metallic pattern 12 from being oxidized in the subsequent annealing process, and the material of the insulating pattern can adopt nitride, oxide, oxynitride or the like with condense structure and high inoxidability at high temperature. Moreover, for example, the insulating pattern 30 can adopt SiOx, SiNx or SiOxNy. As this type of insulating materials are common materials applied in the array substrate, the material selection of the insulating pattern 30 will not increase the overall production cost of the array substrate.

Thirdly, the patterning process indicated in the manufacturing method provided by the embodiments of the present disclosure can be any processes which are performed on film layers (one or more layers) to form specific patterns. The typical patterning process refers to a process of photoresist exposure using one mask, development, etching and removing photoresist. The mask can be a common mask, a half-tone mask or a gray-tone mask, and can be flexibly adjusted according to specific patterning processes. According to different specific patterns, one patterning process can include a plurality of exposures, developments or etching processes, and the specific patterns in formed layer structures can be continuous or discontinuous. The specific patterns can also be disposed at different heights or have different thicknesses.

Fourthly, in the step S02, the parameters such as the annealing temperature, the atmosphere condition and the reaction time involved in the annealing process can refer to conventional technique, and are not limited in the embodiments of the present disclosure, as long as the first amorphous transparent conductive pattern 11 and the second amorphous transparent conductive pattern 21 can be converted into crystalline (e.g., p-ITO) from amorphous state (e.g., a-ITO).

Based on the above-mentioned, in the manufacturing method provided by the embodiment of the present disclosure, because before the annealing of the base substrate with the first conductive pattern 10 and the second conductive pattern 20 formed thereon, the insulating pattern 30 capable of preventing the surface of the first metallic pattern from being oxidized is employed to cover the surface of the first metallic pattern 12, and the surface of the first metallic pattern is away from the base substrate 100 comparatively, the surface oxidization of the first metallic pattern 12 made from metallic materials can be avoided in the annealing process. Therefore, the overall resistance of the first conductive pattern 10 will not be increased due to that no oxide layer is generated, so that the defects such as the increase of the energy consumption and even the disconnection of wirings, electrodes or the like, due to overlarge resistance, can be reduced, and hence the product yield can be improved.

Moreover, for example, the insulating pattern 30, the first conductive pattern 10 and the second conductive pattern 20 are formed in the same patterning process.

In this way, on one hand, as the insulating pattern 30 can be formed without an additional patterning process, the production efficiency of the array substrate can be improved; the patterning processes in the manufacturing process of the array substrate can be reduced; and the mass production rate can be improved. On the other hand, compared with the case that the insulating pattern 30 and the first conductive pattern 10 are manufactured by different patterning processes, as the first conductive pattern 10, the second conductive pattern 20 and the insulating pattern 30 can be formed in the same patterning process in the manufacturing method provided by the embodiment of the present disclosure, the film forming process of the insulating pattern 30 and the film forming process of the first metallic pattern 12 of the first conductive pattern 10 are continuously performed, so that the defects of a contact interface of the first metallic pattern 12 and the insulating pattern 30 are less, and hence the material performances of the patterns can be better.

On the basis, as illustrated in FIGS. 5a to 5e, the step of forming the first conductive pattern 10, the second conductive pattern 20, and the insulating pattern 30 on the base substrate 100, the insulating pattern 30 at least covering the upper surface 10a of the first conductive pattern, and the insulating pattern 30, the first conductive pattern 10, and the second conductive pattern 20 are formed in the same patterning process, includes the following sub-steps.

Figure 5A:
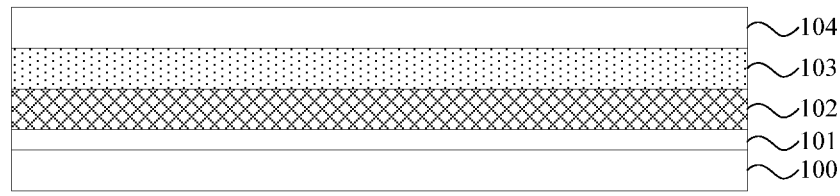
FIGS. 5a to 5e are sequential schematic diagrams of the sub-steps of the step S01 in FIG. 3.

S11: as illustrated in FIG. 5a, sequentially forming a transparent conductive film 101, a metallic film 102, an insulating film 103 and photoresist 104 on the base substrate 100.

For example, the transparent conductive film 101 can be made from ITO or indium zinc oxide (IZO). Limitations are not imposed thereto. The metallic film 102 can include an elemental metal or a metallic alloy, for example, can be made from Cu, with relatively low electric resistivity, relatively stable performance and relatively low price, and alloy materials thereof.

For example, the process of forming the transparent conductive film 101, the metallic film 102, the insulating film 103 and the photoresist 104 can adopt various film forming processes in the conventional technique, for example, various physical vapor deposition (PVD) film forming processes such as vapor deposition method and sputtering method, or various chemical vapor deposition (CVD) film forming processes such as pyrolysis, oxidation, reduction and replacement.

Figure 5B:
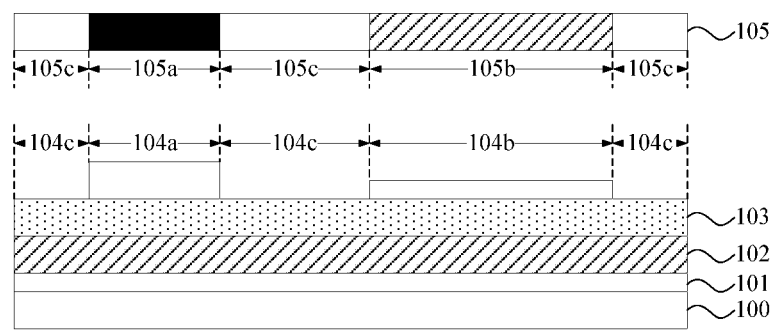

S12: as illustrated in FIG. 5(b), performing exposure and development on the photoresist 104 formed on the base substrate 100 via a half-tone mask 105 or a gray-tone mask, and forming a photoresist-completely-retained portion 104a, a photoresist-partially-retained portion 104b and a photoresist-completely-removed region 104c.

For example, the photoresist-completely-retained portion 104a corresponds to an area of the first conductive pattern 10 to be formed; the photoresist-partially-retained portion 104b corresponds to an area of the second conductive pattern 20 to be formed; and the photoresist-completely-removed region 104c corresponds to other areas.

For example, in the step S12, positive photoresist with higher exposure accuracy can be adopted, namely the photoresist 104 is insoluble in a developer before exposure, and is converted into substances capable of being soluble in the developer after ultraviolet (UV) exposure.

For example, the photoresist-completely-retained portion 104a, the photoresist-partially-retained portion 104b and the photoresist-completely-removed region 104c respectively correspond to a completely opaque region 105a, a partially transparent region 105b and completely transparent region 105c of the half-tone mask 105 or the gray-tone mask. The exposure principle of the half-tone mask 105 or the gray-tone mask can refer to the conventional technique. No further description will be given here.

Figure 5C:
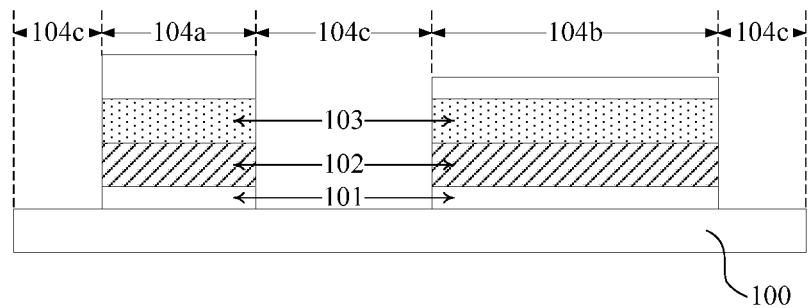
Figure 5D:
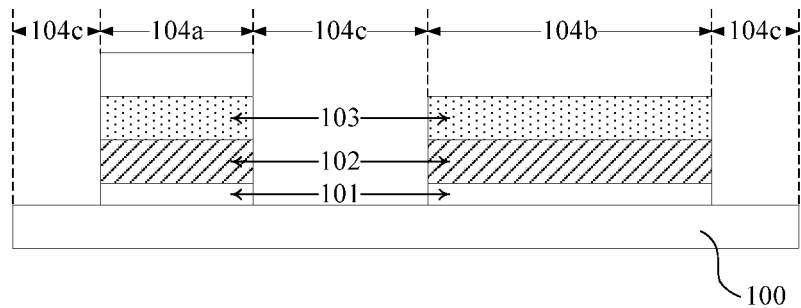

S13: as illustrated in FIG. 5c, removing a portion of the insulating film 103, the metallic film 102 and the transparent conductive film 101 corresponding to the photoresist-completely-removed region 104c by an etching process.

For example, the etching process is not limited to dry etching or wet etching and can also adopt a combination of the two etching processes in any sequence.

For example, as the insulating film 103 is usually made from insulating materials such as nitride, oxide and oxynitride with condense structure and high inoxidability at high temperature, the dry etching process is more suitable to remove the film. Therefore, the dry etching process can be adopted at first to remove a portion of the insulating film 103 where corresponds to the photoresist-completely-removed region 104c. As the metallic film 102 is usually made from elemental metal or metallic alloy materials and the transparent conductive film 101 is usually made from ITO or IZO materials, the wet drying process adopting acid-base, hydrogen peroxide or the like as an etching liquid is more suitable to remove the films. Therefore, after the portion of the insulating film 103 where corresponds to the photoresist-completely-removed region 104c is removed, the wet etching process can be adopted to remove a portion of the metallic film 102 and the transparent conductive film 101 where corresponds to the photoresist-completley-removed region 104c, which is below the insulating film 103.

S14: as illustrated in FIG. 5(*d*), removing the photoresist-partially-retained portion 104b by an ashing process.

Figure 5E:
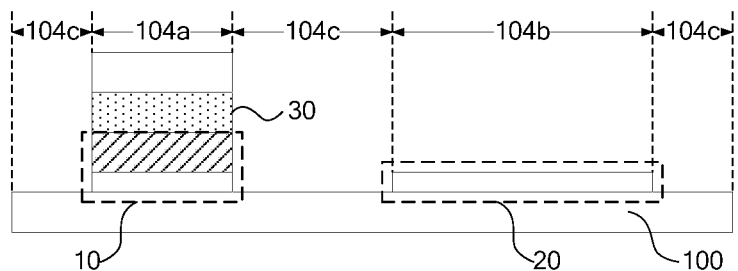

S15: as illustrated in FIG. 5e, removing a portion of the insulating film 103 (not illustrated in the figure) and the metallic film 102 (not illustrated in the figure) corresponding to the photoresist-partially-retained portion 104b by an etching process, and forming the first conductive pattern 10 and the second conductive pattern 20.

For example, the process of etching the insulating film 103 and the metallic film 102 corresponding to the photoresist-partially-retained portion 104b can also refer to the step S13, namely a dry etching process is adopted at first to remove the portion of the insulating film 103 corresponding to the photoresist-partially-retained portion 104b, and subsequently, a wet etching process is adopted to remove a portion of the metallic film 102.

S16: removing the photoresist-completely-retained portion 104a (not illustrated in the figure) by a stripping process, and as illustrated in FIG. 4a, exposing the insulating pattern 30.

Figure 6:
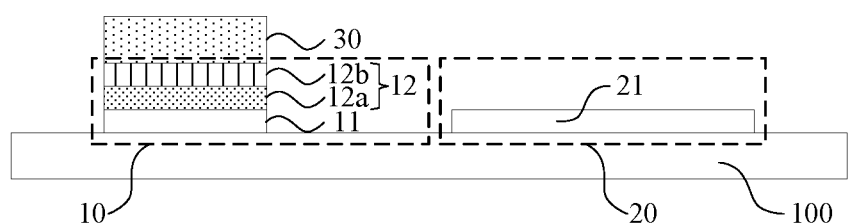
FIG. 6 is a first schematic structural sectional view of an array substrate provided by an embodiment of the present disclosure.

In one example, as illustrated in FIG. 6, the first metallic pattern 12 can include: a first metallic alloy layer 12a and a first elemental metal layer 12b which are away from the base substrate 100 in sequence.

The first metallic alloy layer 12a is equivalent to a base layer of the first elemental metal layer 12b. That is to say, after the transparent conductive film 101 is formed, a film of the first metallic alloy layer 12a and a film of the first elemental metal layer 12b are sequentially formed, and the first metallic pattern 12 composed of a first base layer 12a and a first metal layer 12b can be formed by the above patterning process.

It should be noted that the first metallic alloy layer 12a can enhance the adhesion effect between the first elemental metal layer 12b and the first amorphous transparent conductive pattern 11 on the lower layer, and can also have the function of preventing metal ions in the first elemental metal layer 12b from being diffused into the first amorphous transparent conductive pattern 11.

In a case that the first elemental metal layer 12b is made from Cu or Al elemental materials commonly used in the display technology and the first amorphous transparent conductive pattern 11 is made from a-ITO, a-IZO or other materials, the material of the first metallic alloy layer 12a can include but not limited to at least one selected from the group consisted of molybdenum niobium alloy (MoNb), molybdenum tungsten alloy (MoW), molybdenum titanium alloy (MoTi) or molybdenum zirconium alloy (MoZr).

As the above metallic alloy materials all show the etching selectivity similar to the etching selectivity of the Cu or Al elemental metal materials, the first metallic alloy layer 12a and the first elemental metal layer 12b can be simultaneously etched in the same etching process. Therefore, the selection of the above alloy materials as the first metallic alloy layer 12a not only has the functions of enhancing adhesion and avoiding the diffusion of the metal ions but also can reduce the etching processes and the production cost.

Based on the above-mentioned, for example, the first conductive pattern 10 includes: at least one selected from the group consisted of a pattern of a gate electrode, a pattern of a gate line 13, and a pattern of a common electrode line 14; and the second conductive pattern 20 includes: a pattern of a common electrode 22 or a pattern of a pixel electrode 23.

Figure 7:
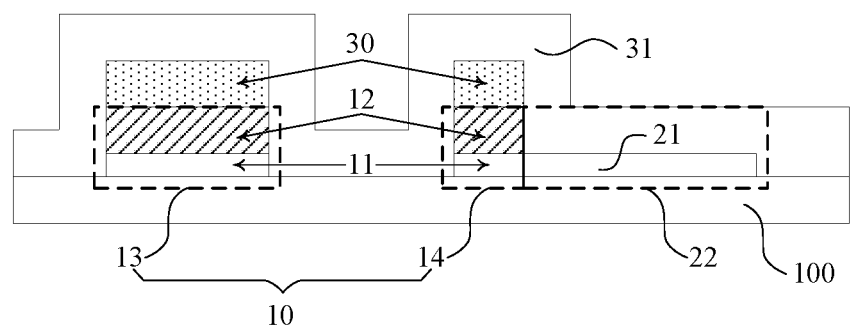
FIG. 7 is a second schematic structural sectional view of an array substrate provided by an embodiment of the present disclosure.
Figure 8:
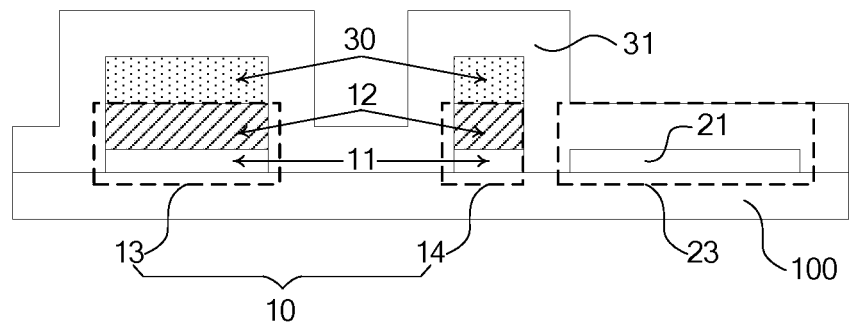
FIG. 8 is a third schematic structural sectional view of an array substrate provided by an embodiment of the present disclosure.

As illustrated in FIG. 7, in a case that the second conductive pattern 20 (not illustrated in the figure) includes the pattern of the common electrode 22, the common electrode line 14 is in contact with the common electrode 22. Or, as illustrated in FIG. 8, in a case that the second conductive pattern 20 includes the pixel electrode 23, the common electrode line 14 and the pixel electrode 23 are not in contact with each other.

It should be noted that: that the first conductive pattern 10 includes at least one selected from the group consisted of the pattern of the gate electrode, the pattern of the gate line 13, or the pattern of the common electrode line 14 refers to that each pattern includes layer structures (the layer structures of the first conductive pattern 10 includes the first amorphous transparent conductive pattern 11 and the first metallic pattern 12) for forming the first conductive pattern 10. As the gate electrode is usually connected with the gate line and corresponding gate signals are inputted through the gate line, the pattern of the gate electrode is in contact with the pattern of the gate line 13. As the function of the common electrode line 14 is to input certain pixel voltage into the common electrode 22, the common electrode line 14 is in contact with the common electrode 22 and is not in contact with the gate electrode and the gate line.

In one example, in order to simplify the patterning process, as illustrated in FIG. 7, a portion of the first amorphous transparent conductive pattern 11 corresponding to the common electrode line 14 and the second amorphous transparent conductive pattern 21 are of an integral structure.

In this way, after the first amorphous transparent conductive pattern 11 and the second amorphous transparent conductive pattern 21 are converted into crystalline, a portion of the first crystalline transparent conductive pattern corresponding to the common electrode line 14 and the second crystalline transparent conductive pattern are of an integral structure.

In one example, before the step S02, the manufacturing method provided by the embodiment of the present disclosure further includes: as illustrated in FIG. 7 or 8, forming a gate insulating layer 31 on the substrate with the first conductive pattern 10, the second conductive pattern 20 and the insulating pattern 30 formed thereon.

The concepts of "TFT region" and "pixel region" are introduced below for easy understanding. The TFT region refers to a region of a TFT formed by the gate electrode and an active layer, a source electrode and a drain electrode formed in the subsequent steps. The pixel region refers to a region formed by the second conductive pattern 20 and another opposite electrode formed in the subsequent step. That is to say, in a case that the second conductive pattern 20 includes the pattern of the common electrode, another electrode formed in the subsequent step is a pixel electrode, and vice versa.

In a case that the insulating pattern 30 only covers the upper surface 10a of the first conductive pattern 10, as the insulating pattern 30 only covers the first conductive pattern 10, and the gate insulating layer 31 covers the entire base substrate, after the subsequent steps of forming the active layer, the source electrode and the drain electrode on the gate insulating layer 31, in the TFT region, a spacing between the gate electrode and the source/drain electrodes includes a sum of a thickness t1 of the insulating pattern 30 and a thickness t2 of the gate insulating layer 31. And in the pixel region, a spacing between the common electrode and the pixel electrode does not include the thickness t1 of the insulating pattern 30.

The capacitance C of a flat capacitor has the following formula:

$$C = \varepsilon \cdot \frac{A}{d};$$

in the formula, ε refers to permittivity of a dielectric; A refers to positive area of plate electrodes; and d refers to a spacing between plate electrodes.

As known from the above formula, the capacitance C is relevant to the permittivity of the dielectric ε, the positive area of the plate electrode A, and the spacing between the plate electrodes d.

In this way, in a case that the sum of the thickness t1 of the insulating pattern 30 and the thickness t2 of the gate insulating layer 31 of an embodiment of the present disclosure is the same with the thickness of the gate insulating layer of the array substrate in the conventional technique, illustratively, t1=t2=2000 Å, namely the thickness of the gate insulating layer is usually 4000 Å in the conventional technique, as the thickness t2 of the gate insulating layer 31 is less than the thickness of the gate insulating layer in the conventional technique, it is equivalent to reduce the spacing between the common electrode and the pixel electrode of the conventional technique. As known from the formula of the flat capacitor, in a case that the permittivity of the dielectric ε and the positive area of the plate electrodes A are not changed, it is equivalent to increase the storage capacitance (Cst) formed between the common electrode and the pixel electrode and hence have the function of improving the display effect.

In the case that the insulating pattern 30 covers the base substrate 100 with the first conductive pattern 10 and the second conductive pattern 20 formed thereon, when the thickness t2 of the gate insulating layer 31 is the same with the thickness of the gate insulating layer of the array substrate in the conventional technique, as the insulating pattern 30 with specific thickness also covers the first conductive pattern 10, it is equivalent to increase the spacing between the gate electrode and the source/drain electrodes. Similarly, as known from the formula of the flat capacitor, in a case that the permittivity of the dielectric and the positive area of the plate electrodes A are not changed, it is equivalent to reduce the parasitic capacitance between the gate electrode and the source electrode (Cgs) and the parasitic capacitance between the gate electrode and the drain electrode (Cgd) and hence solve the problems of signal delay caused by the parasitic capacitance, etc.

Moreover, for example, in order to reduce the cost, the insulating pattern 30 and the gate insulating layer 31 can be made from the same materials.

On this basis, the embodiments of the present disclosure further provide an array substrate manufactured by any one of the above-mentioned manufacturing methods. The array substrate includes a base substrate 100, and a first conductive pattern 10, a second conductive pattern 20, and an insulating pattern 30 disposed on the base substrate 100, and the insulating pattern 30 is located on an upper surface 10a of the first conductive pattern 10 away from the base substrate 100. The first conductive pattern 10 includes a first crystalline transparent conductive pattern and a first metallic pattern 12 which are away from the base substrate 100 in sequence, and the second conductive pattern 20 includes a second crystalline transparent conductive pattern.

For example, the first crystalline transparent conductive pattern and the second crystalline transparent conductive pattern can be disposed in the same layer. It should be noted that disposition in the same layer is in connection with at least two patterns and refers to a structure in which at least two patterns are disposed in the same layer on the base substrate. In general, the at least two patterns are at least two patterns formed from one film made from the same material by a patterning process. For example, "same layer" refers to a layer structure which is formed by one patterning process via the same mask after forming a layer for forming specific patterns by the same film forming process.

On this basis, in one example, for instance, the first metallic pattern 12 can include: a first metallic alloy layer 12a and a first elemental metal layer 12b which are away from the base substrate 100 in sequence.

The first metallic alloy layer 12a can enhance the adhesion effect between the first elemental metal layer 12b and the first crystalline transparent conductive pattern on the lower layer, and can also have the function of preventing metal ions in the first elemental metal layer 12b from being diffused into the first crystalline transparent conductive pattern.

In a case that the first elemental metal layer 12b is made from Cu or Al elemental materials commonly used in the display technology, and the first crystalline transparent conductive pattern is made from crystallized materials such as p-ITO and p-IZO, the material of the first metallic alloy layer 12a can include but not limited to at least one selected from the group consisted of molybdenum niobium alloy (MoNb), molybdenum tungsten alloy (MoW), molybdenum titanium alloy (MoTi) or molybdenum zirconium alloy (MoZr).

As the above metallic alloy materials all show the etching selectivity similar to the etching selectivity of Cu or Al materials, the first metallic alloy layer 12a and the first elemental metal layer 12b can be simultaneously etched by the same etching process. Therefore, the selection of the above metallic alloy materials as the first metallic alloy layer 12a not only can have the functions of enhancing adhesion and avoiding the diffusion of metal ions but also can reduce the etching processes and the production cost.

On this basis, in one example, for example, the first conductive pattern 10 includes: a pattern of a gate electrode, a pattern of a gate line 13, and a pattern of a common electrode line 14, and can also include one or two of the three patterns. Limitations are not imposed thereto. The second conductive pattern 20 includes: a pattern of a common electrode 22 or a pattern of a pixel electrode 23.

As illustrated in FIG. 7, in a case that the second conductive pattern 20 (not illustrated in the figure) includes the pattern of the common electrode 22, the common electrode line 14 is in contact with the common electrode 22. Or, as illustrated in FIG. 8, in a case that the second conductive pattern 20 includes the pixel electrode 23, the common electrode line 14 and the pixel electrode 23 are not in contact with each other.

For example, on this basis, in order to simplify the patterning process, as illustrated in FIG. 7, a portion of the first crystalline transparent conductive pattern corresponding to the common electrode line 14 and the second crystalline transparent conductive pattern are of an integral structure.

Moreover, as illustrated in FIG. 7 or 8, the array substrate can further include: a gate insulating layer 31 disposed on the base substrate with the first conductive pattern 10, the second conductive pattern 20 and the insulating pattern 30 provided thereon.

In a case that the insulating pattern 30 only covers the upper surface 10a of the first conductive pattern 10, as the insulating pattern 30 only covers the first conductive pattern 10 and the gate insulating layer 31 covers the entire base substrate, after the subsequent steps of forming an active layer, a source electrode and a drain electrode on the gate insulating layer 31, in a TFT region, a spacing between the gate electrode and the source/drain electrodes includes a sum of the thickness t1 of the insulating pattern 30 and the thickness t2 of the gate insulating layer 31. And in a pixel region, a spacing between the common electrode and the pixel electrode does not include the thickness t1 of the insulating pattern 30.

In the case that the insulating pattern 30 covers the base substrate 100 provided with the first conductive pattern 10 and the second conductive pattern 20, when the thickness t2 of the gate insulating layer 31 is the same with the thickness of the gate insulating layer of the array substrate in the conventional technique, as the insulating pattern 30 with specific thickness also covers the first conductive pattern 10, it is equivalent to increase the spacing between the gate electrode and the source/drain electrodes. Similarly, as known from the formula of the flat capacitor, in a case that the permittivity of the dielectric and the positive area of the plate electrodes A are not changed, it is equivalent to reduce the parasitic capacitance between the gate electrode and the source electrode (Cgs) and the parasitic capacitance between the gate electrode and the drain electrode (Cgd) and hence solve the problems of signal delay caused by the parasitic capacitance, etc.

In order to reduce the cost, for example, the insulating pattern 30 and the gate insulating layer 31 can be made from the same material.

Moreover, an embodiment of the present disclosure further provides a display panel, which includes any one of the above-mentioned array substrates.

Moreover, an embodiment of the present disclosure further provides a display device, which includes any one of the above-mentioned display panels. For example, the display device can be any product or component with display function such as a liquid crystal display (LCD) panel, a LCD, a LCD TV, an organic light-emitting diode (OLED) display, an OLED TV, an e-paper, a digital picture frame, a mobile phone, a watch and a tablet PC.

It should be noted that all the accompanying drawings of the present disclosure are brief schematic diagrams of the array substrate and the manufacturing method thereof and are only intended to clearly describe the proposal and embody the structures relevant to the disclosure, and other structures irrelevant to the disclosure are the conventional structures and not embodied in the accompanying drawings or only parts are embodied.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

This application claims the benefit of priority from Chinese patent application No. 201510197982.2, filed on Apr. 23, 2015, the disclosure of which is incorporated herein by reference as a part of the present application.

What is claimed is:

1. A manufacturing method of an array substrate, comprising:
    forming a first conductive pattern, a second conductive pattern, and an insulating pattern which at least covers an upper surface of the first conductive pattern on a base substrate, wherein the first conductive pattern comprises: a first amorphous transparent conductive pattern and a first metallic pattern, the first amorphous transparent conductive pattern is closer to the base substrate than the first metallic pattern, and the second conductive pattern comprises a second amorphous transparent conductive pattern; and
    annealing the base substrate with the first conductive pattern, the second conductive pattern and the insulating pattern formed thereon so that the first amorphous transparent conductive pattern and the second amorphous transparent conductive pattern are respectively converted into a first crystalline transparent conductive pattern and a second crystalline transparent conductive pattern.

2. The manufacturing method according to claim 1, wherein the first conductive pattern and the second conductive pattern are formed by one patterning process.

3. The manufacturing method according to claim 1, wherein the insulating pattern, the first conductive pattern and the second conductive pattern are formed in a same patterning process.

4. The manufacturing method according to claim 3, wherein forming the insulating pattern, the first conductive pattern and the second conductive pattern in the same patterning process comprises:
    sequentially forming a transparent conductive film, a metallic film, an insulating film and photoresist on the base substrate;
    performing exposure and development to the photoresist formed on the base substrate via a half-tone mask or a gray-tone mask, so as to form a photoresist-completely-retained portion, a photoresist-partially-retained portion and a photoresist-completely-removed region, wherein the photoresist-completely-retained portion corresponds to an area of the first conductive pattern to be formed; the photoresist-partially-retained portion corresponds to an area of the second conductive pattern to be formed; and the photoresist-completely-removed region corresponds to other areas;
    removing a portion of the insulating film, the metallic film and the transparent conductive film corresponding to the photoresist-completely-removed region by an etching process;
    removing the photoresist-partially-retained portion by an ashing process;
    removing a portion of the insulating film and the metallic film corresponding to the photoresist-partially-retained portion by an etching process, and forming the first conductive pattern and the second conductive pattern; and
    removing the photoresist-completely-retained portion by a stripping process, and exposing the insulating pattern.

5. The manufacturing method according to claim 1, wherein the first metallic pattern comprises: a first metallic alloy layer and a first elemental metal layer, the first metallic alloy layer is closer to the base substrate than the first elemental metal layer.

6. The manufacturing method according to claim 1, wherein
the first conductive pattern comprises at least one selected from the group consisting of a pattern of a gate electrode, a pattern of a gate line, and a pattern of a common electrode line.

7. The manufacturing method according to claim 1, wherein the second conductive pattern comprises a pattern of a common electrode or a pattern of a pixel electrode.

8. The manufacturing method according to claim 6, wherein the first conductive pattern comprises the pattern of the common electrode line; and a portion of the first amorphous transparent conductive pattern corresponding to the common electrode line and the second amorphous transparent conductive pattern are of an integral structure.

9. The manufacturing method according to claim 1, further comprising:
forming a gate insulating layer on the base substrate with the first conductive pattern, the second conductive pattern and the insulating pattern formed thereon.

10. An array substrate, comprising:
a base substrate; and
a first conductive pattern, a second conductive pattern, and an insulating pattern disposed on the base substrate, the insulating pattern at least covering an upper surface of the first conductive pattern, wherein
the first conductive pattern comprises a first crystalline transparent conductive pattern and a first metallic pattern, the first crystalline transparent conductive pattern is closer to the base substrate than the first metallic pattern; and the second conductive pattern comprises a second crystalline transparent conductive pattern.

11. The array substrate according to claim 10, wherein the first metallic pattern comprises: a first metallic alloy layer and a first elemental metal layer, the first metallic alloy layer is closer to the base substrate than the first elemental metal layer.

12. The array substrate according to claim 10, wherein
the first conductive pattern comprises at least one selected from the group consisting of a pattern of a gate electrode, a pattern of a gate line, and a pattern of a common electrode line.

13. The array substrate according to claim 10, wherein the second conductive pattern comprises a pattern of a common electrode or a pattern of a pixel electrode.

14. The array substrate according to claim 12, wherein the first conductive pattern comprises the pattern of the common electrode line; and a portion of the first crystalline transparent conductive pattern corresponding to the common electrode line and the second crystalline transparent conductive pattern are of an integral structure.

15. The array substrate according to claim 10, further comprising:
a gate insulating layer disposed on the base substrate provided with the first conductive pattern, the second conductive pattern and the insulating pattern.

16. The array substrate according to claim 10, wherein the first crystalline transparent conductive pattern and the second crystalline transparent conductive pattern are disposed in a same layer.

17. A display panel, comprising the array substrate according to claim 1.

18. A display device, comprising the display panel according to claim 17.

19. The manufacturing method according to claim 2, wherein the first metallic pattern comprises: a first metallic alloy layer and a first elemental metal layer, the first metallic alloy layer is closer to the base substrate than the first elemental metal layer.

20. The manufacturing method according to claim 3, wherein the first metallic pattern comprises: a first metallic alloy layer and a first elemental metal layer, the first metallic alloy layer is closer to the base substrate than the first elemental metal layer.

* * * * *